United States Patent [19]

Jones

[11] 3,743,973

[45] July 3, 1973

[54] ACOUSTIC SURFACE-WAVE VELOCITY TRANSFORMATION

[75] Inventor: William Stanley Jones, Richardson, Tex.

[73] Assignee: Texas Instruments Incorporated, Dallas, Tex.

[22] Filed: July 26, 1971

[21] Appl. No.: 166,045

[52] U.S. Cl. .......... 333/30 R
[51] Int. Cl. .......... H03h 9/30
[58] Field of Search .......... 333/30, 72

[56] References Cited

OTHER PUBLICATIONS

Stern: Microsound Components, Circuits & Applications, IEEE Transactions on Microwave Theory & Techniques MTT-17, November 1969, pp. 835-844.

Ash et al.: Microsound Surface Waveguides IEEE Transactions on Microwave Theory & Techniques MTT-17, November 1969, pp. 882-892.

Carr: The Generation & Propogation of Acoustic Surface Waves at Microwave Frequencies IEEE Transactions on Microwave Theory & Technique MTT-17, November 1969, pp. 845-855.

Collins et al.; Amplifying Acoustic Surface Waves Electronics Dec. 8, 1969, pp. 102-111.

*Primary Examiner*—Herman Karl Saalbach
*Attorney*—Harold Levine et al.

[57] ABSTRACT

A structure for generating an acoustic surface wave in a non-piezoelectric substrate includes a thin layer of piezoelectric material over a portion of the substrate. An interdigital transducer is formed on the piezoelectric material, and the end of the layer opposite one or both radiating directions of the transducer is tapered to reduce reflection of the surface wave as it propagates through the boundary between the piezoelectric layer and the substrate. A waveguide structure having a tapered end is also described.

8 Claims, 5 Drawing Figures

INVENTOR
William Stanley Jones

BY Richard L Donaldson
ATTORNEY

ACOUSTIC SURFACE-WAVE VELOCITY TRANSFORMATION

Acoustic surface waves are playing an increasingly important role in delay lines and signal processing. Generally piezoelectric substrates are utilized since it is much easier to generate an acoustic surface wave and subsequently detect the surface wave on these types of materials. In some applications however, the ease of generating acoustic surface waves in piezoelectric materials is offset by the fact that such materials are generally anisotropic and cannot be used for applications requiring direction of propagation charges such as couplers etc.. On the other hand, suitable materials that are isotropic and thus suited for these waveguide-type structures are often non-piezoelectric.

Several methods have been suggested for generating surface waves in non-piezoelectric material. These include, for example, fluid coupling to a piezoelectric crystal having an interdigital transducer, wedge couplers, scattering from bulk waves, and piezoelectric film overlays.

With respect to piezoelectric film overlays, a conventional interdigital surface wave transducer may be formed on the piezoelectric film. Various configurations of the transducer, substrate, and piezoelectric layer, including an intermediate ground reference plane are described, for example, in Smith, "A Coupling Efficiency Estimate for Acoustic Surface Waves Excitation with Piezoelectric Film Overlays, " Journal of Applied Physics, Vol. 42, No. 7, June 1971. One of the problems associated with thin film overlays results when the generated acoustic surface waves propagate through the boundry of the thin piezoelectric film. Typically a significant amount of the surface wave energy is reflected by the abrupt termination of the piezoelectric layer. This reflected energy significantly detracts from the usefulness of this technique in generating an acoustic surface wave in a non-piezoelectric substrate.

To reduce the reflected acoustic surface wave it has been proposed to taper the thickness of the thin piezoelectric layer — for example reference Stein, Microsecond Components, Circuits and Applications M. T. T. Lincoln Labs Technical Note, 1968. The tapering of this thin layer (which typically is just a fraction of an acoustic wave length in thickness) in the center portion of a substrate is very difficult to achieve necessitating lapping very accurately and selectively, or somehow depositing material with the vertical gradient required.

Accordingly an object of the present invention is to provide an improved structure for generating an acoustic surface wave in a non-piezoelectric substrate.

Another object of the invention is to form a thin piezoelectric layer having a section tapered in width, using conventional photolithographic techniques.

Another object of the invention is to provide a structure on a non-piezoelectric substrate that includes an acoustic waveguide.

Briefly and in accordance with the present invention, a structure is provided for generating an acoustic wave in a non-piezoelectric substrate. A relatively thin layer of a piezoelectric material is formed over a first region of one surface of the substrate and an interdigital transducer is formed on the piezoelectric material. One or both ends of the thin layer of piezoelectric material is tapered in width in order to reduce reflections of the propagating surface wave. In one embodiment of the invention, an elongated layer capable of propagating an acoustic surface wave is formed on the substrate adjacent the piezoelectric material on which the surface wave transducer is formed. This elongated region serves as a waveguide and preferably the end adjacent the surface wave transducer is also tapered in width.

Other objects and advantages of the present invention will become apparent upon reading the following specification in conjunction with the drawings wherein.

Figure 1:
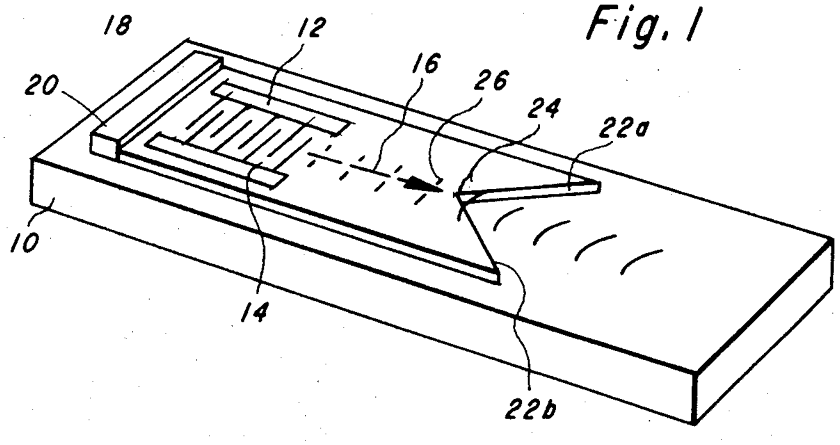
FIG. 1 is a pictorial view illustrating one embodiment of the present invention for generating an acoustic surface wave in a non-piezoelectric substrate.

With reference now to the drawings, FIG. 1 illustrates an embodiment of the invention that may be utilized to generate acoustic surface waves in a non-piezoelectric substrate 10. Depending upon design consideration various materials may be used for the substrate 10. For example, Texas Instrument's chalcogenide infrared transmitting glass (1173) has advantageous characteristics. A relatively thin layer 12 of a piezoelectric material is formed over a first region on one surface of the substrate 10. By way of example, the layer 12 may comprise zinc oxide formed by conventional sputtering techniques. Generally the layer 12 is formed to be less than one wavelength in thickness. As used herein, the term "relatively thin" will refer to a structure that is less than one wavelength of the acoustic surface wave in thickness.

The thin layer 12 may be patterned by conventional photolithographic masking and etching techniques. A conventional interdigital transducer 14 is formed on the layer 12. As understood by those skilled in the art such an interdigital surface wave transducer may be utilized to generate an acoustic surface wave in a piezoelectric material. The surface wave thus generated will propagate in the directions shown by the arrows 16 and 18, for typical bidirectional transducers. Since the layer 12 is less than one wavelength in thickness, a significant portion of the wave propagates on the overlay/substrate surface region. To prevent the acoustic surface wave which propagates in the direction 18 from reflecting from the edge 11 of the piezoelectric layer 12 and interferring with device operation, a layer 20 of absorbing or antireflecting material is formed on one end of the layer 12. Such materials are well known in the art, such as, e.g. rubber cement or black wax.

In accordance with the present invention the acoustic surface wave generated by the transducer 14 in the direction 16 on the layer/substrate composite is propagated at a different velocity than in the substrate 10 alone. For the embodiment illustrated in FIG. 1, materials are chosen such that the velocity of the acoustic surface associated with the substrate 10 is slower than the velocity of the acoustic surface wave propagation in the piezoelectric layer 12. As will be explained hereinafter, such an arrangement advantageously causes the acoustic beam generated by the transducer 14 to converge.

In FIG. 1 the side of the piezoelectric layer 12 opposite the absorbing layer 20 is formed to have a V shaped boundry such that the sides 22*a*, 22*b*, of the boundary taper inwardly to join at a vertex 24. Thus an acoustic surface wave generated by the transducer 14 traveling in the direction 16, will first strike the vertex 24 of the V shaped boundary. of the piezoelectric layer 12. Very little of the surface wave will be reflected from the pointed juncture 24. Similarly, the amount of energy reflected from the tapered sides of the boundary of the layer 12 is small as compared to an abrupt termination of the layer. That energy which is reflected is reflected at an angle to the path of propagation 14 and does not seriously impair device operation. As the acoustic surface wave continues to propagate along the substrate 10 the central portion of the wavefront will be propagating entirely in the substrate 10 while the outer portions of the acoustic surface wavefront will still be traveling in the piezoelectric layer/substrate composite region. A typical wavefront is shown generally at 26. For the situation where the velocity of propagation of a surface wave in the layer 12 is greater than the velocity of propagation of the surface wave in the substrate 10, the wavefront will become curved or concave shaped - in other words, it will be convergent. This has the advantage of reducing acoustic beam spreading.

Figure 2:
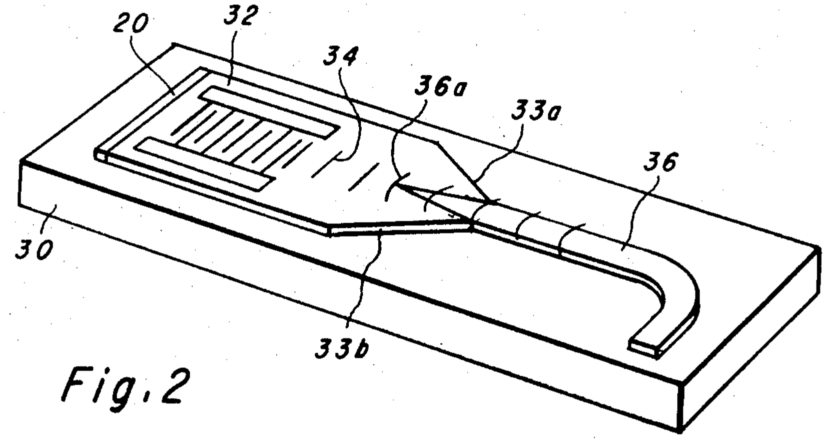
FIG. 2 illustrates an embodiment of the invention that incorporates a waveguide.

With reference to FIG. 2 there is illustrated an embodiment of the present invention where the velocity of surface wave propagation in the substrate 30 is greater than the velocity of surface wave propagation in an overlying piezoelectric material 32. In this embodiment the substrate may comprise fuzed quartz or sapphire, e.g., and the piezoelectric layer may comprise cadmium sulfide or zinc oxide. For this situation it is preferred that the sides 33*a* and 33*b* of the layer 32 slope away from the transducer 14 to form a vertex. For this situation acoustic wavefronts, shown generally at 34, will tend to converge as they pass the tapered edges 33*a* and 33*b* of the piezoelectric layer 32 and propagate entirely in the substrate 30. A waveguide 36 is also illustrated in FIG. 2. The waveguide is formed by a relatively thin layer of material capable of propagating and guiding an acoustic surface wave. The waveguide 36 is relatively narrow as compared with the width of the interdigital transducer 14. Generally the waveguide material is a non-piezoelectric composition and may for example, comprise gold. The waveguide 36 is formed to have a tapered end 36 which is enclosed by the sloping edges 33*a* and 33*b* of the piezoelectric layer 32. The material for the waveguide 36 is chosen to have a surface wave propagation velocity that is slower than that of the piezoelectric material 32. Thus when the representative wavefronts 34 enter the waveguide material 36 the portion traveling through the material 36 propagates slower than that portion of the waveguide still traveling in the piezoelectric layer 32 and also that portion of the wavefront that is propagating through only the substrate 30. Again this tends to curve the edges of the surface wavefront so that they converge toward the boundaries of the waveguide 36. In this manner the acoustic surface wave may be channeled or guided along the surface of the substrate 10. By way of example, the waveguide 36 is shown as being curved to graphically illustrate this feature. A substrate that is isotropic is chosen so that the waveguide 36 may be curved and the information content propagated through the waveguide still retained. In other words, if an anisotropic substrate were used, as the direction of propagation changed the velocity, etc., of the propagating surface wave would vary and could destroy the information content.

Figure 3:
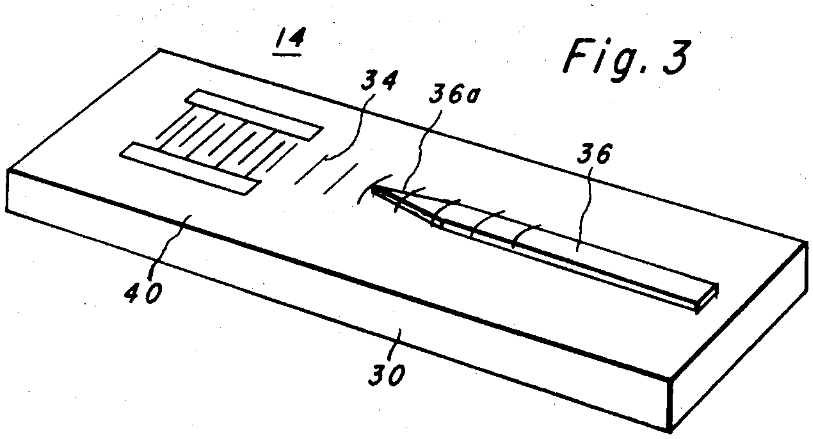
FIG. 3 illustrates a waveguide structure of the present invention formed on a piezoelectric substrate.

With reference to FIG. 3 there is illustrated a structure that may be utilized in accordance with the present invention to transform into an acoustic surface waveguide on a piezoelectric substrate. Since the substrate 40 is piezoelectric in this embodiment the transducer 14 may be formed directly on the substrate surface. The transducer 14 is effective to generate acoustic surface waves, representative wavefronts of which are shown generally at 34. A relatively thin layer of material is formed and patterned to define the waveguide 36. The end of the waveguide 36 adjacent the transducer 14 is formed to have sloping sides which terminate in a vertex 36*a*. Further, the material for the waveguide 36 is chosen to have a slower surface wave propagation velocity than the substrate 40. Thus, when the wavefront 34 encounters the tip 36*a* of the waveguide, the center portion of the wavefront 34 propagates at a slower velocity and thus the ends of the wavefront tend to curve toward the edges of the waveguide 36. Since the waveguide 36 has sloping sides there is substantially reduced reflection of the wavefront 34 from the interface between the propagating surface wave 34 and the waveguide 36. The tapered edges of the waveguide may be fabricated in accordance with conventional photolithographic fabrication techniques.

Figure 4:
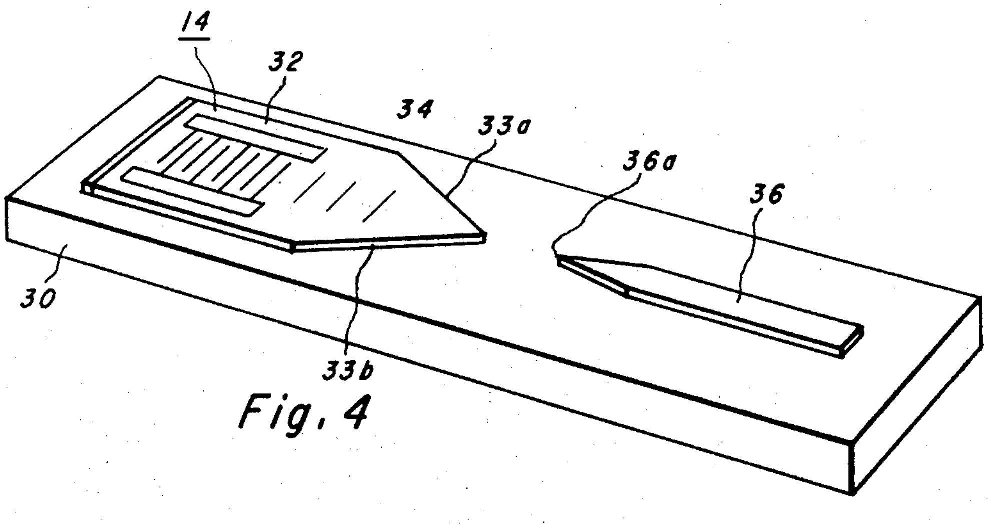
FIG. 4 is a pictorial view illustrating a waveguide structure in conjunction with a layer of piezoelectric material having a tapered end for generating an acoustic surface wave in a non-piezoelectric substrate.

With reference to FIG. 4 there is illustrated an embodiment of the present invention for generating an acoustic surface wave in a non-piezoelectric substrate. This embodiment is similar to that shown in FIG. 2. In this case, however, the layer 32 of piezoelectric material is formed to have sloping sides 33*a*' and 33*b*' which join at a vertex 33*c*. Spaced from the vertex 33*c* and in alignment with the acoustic beam generated by the transducer 14, there is formed a surface waveguide 36 which has a tapered end 36*a*. Since the velocity of surface wave propagation in the substrate is faster than that in the material for the overlay/substrate composite and is faster than the velocity of surface propagation in the waveguide 36, the acoustic surface wave shown generally by the numeral 34 will be convergent as it propagates from the layer 32 to the waveguide 36. Further, since the adjacent boundaries of the piezoelectric layer 32 and waveguide 36 have tapering ends the amount of reflection of the acoustic surface wave 34 as it passes these boundaries is significantly reduced as compared to situations where abrupt boundaries are formed.

Figure 5:
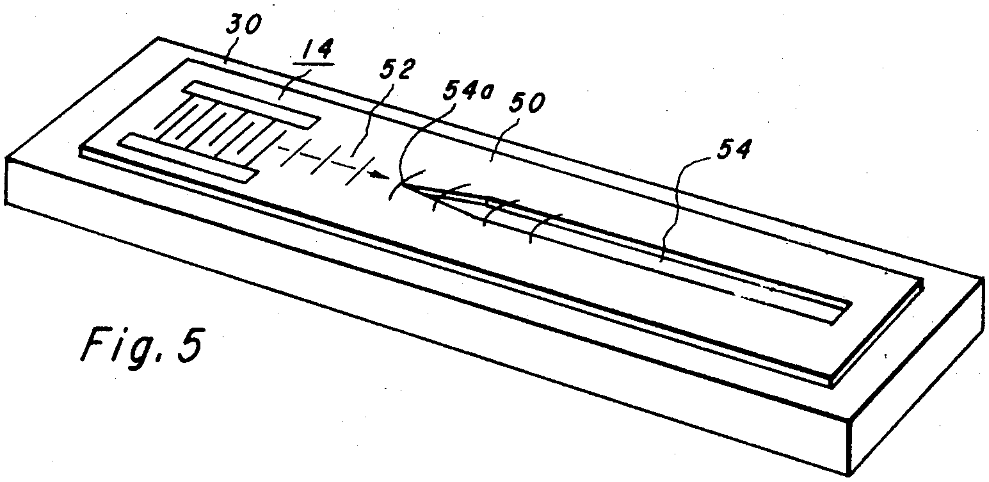
FIG. 5 illustrates an embodiment of the invention wherein a thin layer of piezoelectric material with a channel therethrough having a tapered end is utilized.

With reference to FIG. 5 a different embodiment of the invention is illustrated. This embodiment also utilizes a non-piezoelectric substrate 30. A thin layer 50 of a piezoelectric material is formed to overlie a surface of the substrate 30, and an interdigital transducer 14 is formed in one region of the piezoelectric layer 50 for generating an acoustic surface wave along one axis, shown generally by the arrow 52 of the layer 50. An aperture 54 is opened to extend through the thin layer 50. This aperture may for example, be opened by a conventional photolithographic technique. The end of the aperture 54 adjacent the transducer 14 has tapering sides that terminate at a vertex 54*a*. The piezoelectric layer 50 is chosen to have a higher surface wave propagation velocity than the substrate 30 so that the acoustic surface wave will be channeled in the region of the substrate underlying the aperture 54, thereby forming a waveguide.

The relative size of the various elements of the embodiments above described will vary with design considerations. Typically, however, the surface waveguide such as 36 may be on the order of just a few mils in width while the width of the acoustic beam generated by the transducer 14 may be on the order of 50 to 100 mils or more. Preferably the tapered sections of waveguides and piezoelectric layer in accordance with the invention have a length in the range of from 10 to 100 wavelengths of the acoustic surface wave.

While specific embodiments of the present invention have been described herein it will be apparent to persons skilled in the art that various details as to the construction may be made without departing from the scope or spirit of the invention.

What is claimed is:

1. A structure for generating an acoustic surface wave in a non-piezoelectric substrate comprising:

a. a non-piezoelectric substrate capable of propagating an acoustic surface wave at a first velocity;

b. a thin piezoelectric layer having substantially uniform thickness formed over a first region on one surface of said substrate, said piezoelectric layer having an axis along which the velocity of surface wave propagation is different from said first velocity, said layer defining a boundary interface with said substrate along said axis, said boundary interface having an effective cross-sectional width which is tapered from a maximum to a point; and c. means for generating an acoustic surface wave in said piezoelectric material and said substrate thereunder that propagates along said axis.

2. A structure for generating an acoustic surface wave in a non-piezoelectric substrate comprising:

a. a non-piezoelectric substrate capable of propagating an acoustic surface wave at a first velocity;

b. a thin piezoelectric layer formed over a first region on one surface of said substrate, said piezoelectric layer having an axis along which the velocity of surface wave propagation is greater than said first velocity, a portion of said layer intersecting said axis terminating in a V shaped boundary, the vertex of which is directed along said axis; and c. means on said layer for generating an acoustic surface wave in said piezoelectric layer and said substrate thereunder having a propagation path along said axis, said means disposed adjacent said vertex.

3. A structure for generating an acoustic surface wave in a non-piezoelectric substrate comprising:

a. a non-piezoelectric substrate capable of propagating an acoustic surface wave at a first velocity;

b. a thin piezoelectric layer formed over a first region on one surface of said substrate, said piezoelectric layer having an axis along which the velocity of surface wave propagation is less than said first velocity, the side of said layer intersecting said axis terminating in a V shaped boundary, the vertex of which is directed along said axis away from the inner portion of said layer; and c. means for generating an acoustic surface wave in said piezoelectric layer and said substrate thereunder that propagates along said axis.

4. A structure for guiding an acoustic surface wave in a non-piezoelectric substrate comprising in combination:

a. a substantially isotropic non-piezoelectric substrate capable of propagating an acoustic surface wave at a first velocity;

b. a first relatively narrow elongated thin layer of material on said substrate capable of propagating an acoustic surface wave at a second velocity that is slower than said first velocity, said first layer defining a waveguide one end of which is tapered in width;

c. a second relatively wide elongated thin layer of piezoelectric material capable of propagating an acoustic surface wave at a velocity intermediate said first and second velocities, one end of said second layer enclosing at least a portion of said tapered end; and d. means for generating an acoustic surface wave in said second layer along a path in alignment with said waveguide.

5. A structure for guiding an acoustic surface wave comprising:

a. a piezoelectric substrate capable of propagating an acoustic surface wave at a first velocity along an axis thereof;

b. means on said substrate for generating an acoustic surface wave; and c. a relatively thin elongated layer of substantially uniform thickness capable of propagating an acoustic surface wave at a second velocity which is slower than said first velocity positioned along said axis on one surface of said substrate, the end of said elongated layer adjacent said surface wave generating means tapered to a point in cross-section width.

6. A structure for guiding an acoustic surface wave in a non-piezoelectric substrate comprising in combination:

a. a substantially isotropic non-piezoelectric substrate capable of propagating an acoustic surface wave at a first velocity;

b. a first relatively narrow elongated thin layer of material on said substrate capable of propagating an acoustic surface wave at a second velocity that is slower than said first velocity, said first layer defining a waveguide, one end of which is tapered in width to a point;

c. a second relatively wide elongated thin layer of piezoelectric material capable of propagating an acoustic surface wave along an axis at a velocity intermediate said first and second velocities, one end of said second layer being tapered to a point and spaced opposite from said tapered end of said waveguide along said axis; and d. means for generating an acoustic surface wave in said second layer along said axis.

7. A structure for guiding an acoustic surface wave in a non-piezoelectric substrate comprising in combination;

a. a substantially isotropic non-piezoelectric substrate capable of propagating an acoustic surface wave at a first velocity;

b. a thin layer of piezoelectric material covering one surface of said substrate having an elongated aperture therethrough exposing a region of said substrate, one end of said aperture being tapered in width, said layer having a surface wave propagation velocity which is greater than said first velocity; and c. means for generating an acoustic surface wave in said layer, said means in alignment with the tapered end of said aperture and spaced therefrom.

8. An acoustic surface wave propagating structure comprising a thin layer characterized by a first acoustic surface wave propagating velocity, said layer defined on a substrate characterized by a second different surface wave propagating velocity, said layer disposed on said substrate along the path traversed by an acoustic surface wave, said layer defining a boundary interface with said substrate in said path of propagation, said boundary interface having an effective cross sectional width through which said surface wave propagates which tapers from a maximum to zero, the boundary walls of said tapered portion defined at an angle to said path of propagation such that acoustic surface wave reflection therefrom is substantially reduced upon said surface wave being transformed from propagation at one velocity to propagation at the other velocity.

* * * * *